United States Patent
Wamble (10) Patent No.: US 10,032,393 B2
(45) Date of Patent: Jul. 24, 2018

(54) SYSTEM, APPARATUS AND METHOD FOR LIGHT DIFFUSION AND TESTING FOR FIXTURES

(71) Applicant: Architectural Safety Components, LLC, Houston, TX (US)

(72) Inventor: Mark Scott Wamble, Houston, TX (US)

(73) Assignee: Architectural Safety Components, LLC, Houston, TX (US)

(*) Notice: Subject to any disclaimer, the term of this patent is extended or adjusted under 35 U.S.C. 154(b) by 468 days.

(21) Appl. No.: 14/456,828

(22) Filed: Aug. 11, 2014

(65) Prior Publication Data

US 2015/0042347 A1  Feb. 12, 2015

Related U.S. Application Data

(60) Provisional application No. 61/865,015, filed on Aug. 12, 2013.

(51) Int. Cl.

| | |
|---|---|
| *F21V 3/00* | (2015.01) |
| *F21V 5/00* | (2015.01) |
| *F21V 11/00* | (2015.01) |
| *F21V 1/00* | (2006.01) |
| *G09F 13/04* | (2006.01) |
| *G09F 19/22* | (2006.01) |
| *H05B 33/08* | (2006.01) |
| *H05B 37/02* | (2006.01) |

(Continued)

(52) U.S. Cl.
CPC .......... *G09F 13/0409* (2013.01); *G09F 19/22* (2013.01); *H05B 33/0842* (2013.01); *H05B 37/0254* (2013.01); *G01R 31/44* (2013.01); *H02J 9/061* (2013.01)

(58) Field of Classification Search
CPC ............. G09F 13/0409; G09F 13/0404; G09F 13/041; G09F 19/22; G01R 31/443; F21V 5/04; F21V 5/002; F21V 5/005; F21S 4/28; F21S 4/20; F21Y 2103/10
See application file for complete search history.

(56) References Cited

U.S. PATENT DOCUMENTS

| | | |
|---|---|---|
| D242,087 S | 10/1976 | Reeves |
| 7,086,769 B1 * | 8/2006 | Thompson ........... G02B 6/0001 361/236 |

(Continued)

OTHER PUBLICATIONS

Phillips Lightolier, TX2 Thermoplastic Exit Series, http://www.lightolier.com/MKACatpdfs/TX2.PDF, printed Nov. 8, 2013.

(Continued)

*Primary Examiner* — Erin Kryukova
(74) *Attorney, Agent, or Firm* — Hitchcock Evert LLP (57) ABSTRACT

A system, apparatus and method for light diffusion and testing fixtures. The system includes remote derangement controls to test the operation of a battery backup system associated with a fixture. The light fixture may incorporate light diffusion features including back mounted light sources, channeled corners in a translucent material and/or pitted surfaces of a translucent material. The system may further include remote monitoring elements and/or sensors to evaluate proper operation of the light diffusion characteristics of a fixture during operation of the battery backup system.

8 Claims, 6 Drawing Sheets

(51) Int. Cl.
*G01R 31/44* (2006.01)
*H02J 9/06* (2006.01)

(56) References Cited

U.S. PATENT DOCUMENTS

| | | | |
|---|---|---|---|
| 7,101,056 B2* | 9/2006 | Pare | G09F 13/14 |
| | | | 362/190 |
| D555,738 S | 11/2007 | Goldberg et al. | |
| D611,547 S | 3/2010 | Mirica et al. | |
| D625,363 S | 10/2010 | Lee | |
| D659,194 S | 5/2012 | Hetrick | |
| 8,341,859 B2 | 1/2013 | Culiver | |
| 8,449,142 B1* | 5/2013 | Martin | G09F 9/33 |
| | | | 362/217.1 |
| D713,461 S | 9/2014 | Wamble | |
| D717,870 S | 11/2014 | Wamble | |
| D717,871 S | 11/2014 | Wamble | |
| 2006/0225326 A1 | 10/2006 | Robinson et al. | |
| 2007/0283604 A1* | 12/2007 | Kaoh | G09F 13/22 |
| | | | 40/552 |
| 2009/0277059 A1* | 11/2009 | Kwon | B60Q 1/50 |
| | | | 40/581 |
| 2010/0107462 A1 | 5/2010 | Lee | |
| 2011/0069486 A1* | 3/2011 | Martin | F21V 3/04 |
| | | | 362/235 |
| 2011/0271569 A1* | 11/2011 | Nelson | G09F 13/04 |
| | | | 40/552 |
| 2014/0369041 A1* | 12/2014 | Fallon | G09F 13/0404 |
| | | | 362/236 |

OTHER PUBLICATIONS

Lithonia Lighting, TLE Signature Thin Die-Cast Aluminum Exits with LED Lamps, http://www.lithonia.com/commercial/tle.html#.Un1A8nDkuzw, printed Nov. 8, 2013.
Lithonia Lighting, LRP EL N Precise Edge-Lit Exit, http://www.acuitybrandslighting.com/library/ll/documents/specsheets/lrp-el-n.pdf, printed Nov. 8, 2013.
Phillips Lightolier, EX2 Series Steel Edge-Lit LED Exit, http://www.lightolier.com/MKACatpdfs/EX2.PDF, printed Nov. 8, 2013.
Phillips Lightolier, TE Series Self-Luminous Exit, http://www.lightolier.com/MKACatpdfs/TE.PDF, printed Nov. 8, 2013.
Interloop-Architecture, E-X-I-T, http://www.interlooparchitecture.net/e-x-i-t/, printed Apr. 10, 2014.
Dawn Finley, Assuming Risk, Log 5, Summer/Spring 2005, at 37.
Transmaterial: A Catalog of Materials That Redefine Our Physical Environment 205 (Blaine Brownell ed., Princeton Architectural Press 2006).

\* cited by examiner

SYSTEM, APPARATUS AND METHOD FOR LIGHT DIFFUSION AND TESTING FOR FIXTURES

CROSS-REFERENCE TO RELATED APPLICATION

This application claims the benefit of priority from U.S. Provisional Patent Application No. 61/865,015 filed on Aug. 12, 2013, which is incorporated herein by reference.

FIELD OF THE DISCLOSURE

The invention relates generally to the field of lighting fixtures. More specifically, the invention relates to diffusing light through materials of a light fixture and the testing of the operations of a fixture.

BACKGROUND

Light fixtures exist with different aesthetic designs and looks. For light fixtures used to show structured shapes, such as lettering, certain lighting designs are used to emphasize the lettering. For one example, neon lighting has been used to show lettering using light. For another example, some signs use light bulbs with in a frame making letters with the front comprising a translucent or semi-translucent material, such as plastic. The plastic is lit by the light bulbs within the frame; however, the location of each light is visible through the material as a bright spot, or "hotspot", with the light diming towards areas away from the location of the light. The hotspots are also apparent from the side in designs with the translucent or semi-translucent material is designed for a three-dimensional shape.

Some light fixtures are designed to minimize the hotspots by reflecting the light within the frame of a sign such that only indirect light is apparent on the translucent or semi-translucent material. In such designs, the frame includes sufficient internal area and reflective materials to bounce the light within the frame before it passes through the translucent or semi-translucent material. For example, the frame includes a box with semi-translucent lettering in one face of the box, internal mirrors and lights along one side. When the lights are turned on the light they produce is bounced off the internal mirrors, often bouncing off multiple mirrors to mix the light, until it is directed to the semi-translucent lettering.

Some light fixtures are designed with test features to ensure the lights are properly operating under the selected test conditions. For example, emergency light fixtures are designed to remain operating using a battery backup even when the main power is unavailable. Such light fixtures include the battery backup and a test button in the fixture and/or the mounting structure. During a test, a person will press and hold the test button on the light fixture and observe the light emitted by the light fixture to ensure the battery backup is operating properly. Under certain regulations, each emergency light fixture must be tested multiple times during the year for an extended period of time. For example, the person may be required to test each light fixture in a building twice a year for 30 minutes. Some of the light fixtures may also be difficult or burdensome to access. For example, exit signs located over a tall doorway may require a person to use a ladder and remain on the ladder for an extended period during the test.

SUMMARY

The present disclosure includes systems, apparatuses and methods for diffusing light in light fixtures having a minimal space and testing fixtures remotely. More specifically, the light diffusion system uses multiple elements to provide near uniform light distribution through translucent shaped components of compact light fixtures. The remote test system provides test features to allow a person to observe the fixture while testing the fixture from a remote location. During the remote test of a light fixture having the light diffusion elements, the distance from the light fixture may improve the person's capability to observe whether the light fixture maintains the even distribution of light during the test.

Embodiments of the present disclosure provide for light diffusion systems incorporating light placement at a maximum distance from the translucent material within the compact frame, light diffusion channels in the translucent material and/or pitted surfaces on one or more sides of the translucent material. In some embodiments, the light source is a series of light emitting diodes (LEDs) mounted on a circuit board placed in the back of a frame. In some embodiments, the LEDs are mounted on the back of the circuit board and holes through the circuit board allow the light to pass through the holes to the translucent material.

In some embodiments, the light fixture includes structured lettering with a back frame component made of an opaque material, such as a metal, and three-dimensional lettering made of a translucent material mounted on the back frame. In some embodiments, the interior of the translucent material includes light diffusion channels designed to allow the light to diffuse in a semi-uniform manner throughout the exterior surface of the translucent material. In some embodiments, the channels are located in the corners of the design to reduce the thickness of the translucent material into the corner.

In some embodiments, the translucent material includes a plurality of pits, divots or curvatures in the surface to diffuse the light travelling through the translucent material. In some embodiments, the pits are only located on certain surfaces of the translucent material, such as the interior surfaces only. In some embodiments, the pit may be of a minimal size and the number of pits is maximized on a surface to create a multitude of diffusion pits in the surface.

In some embodiments, the light fixture is an exit sign with individualized letters made of a translucent material wherein the fixture includes light diffusion characteristics for each of the individualized letters. In some embodiments, the individualized letters are mounted on a common back plate. In some embodiments, the light fixture is associated with a battery backup and test control.

In some embodiments, the system includes a remote device to test a fixture. The remote testing device may be a test control located in a position such that an operator may view the fixture and engaged the test control to ensure the fixture continues to operate properly. In some embodiments, the test control may be a button designed to disengage the main power from the fixture causing the battery backup components to operate as if the main power has been lost. Based upon the disengagement of the main power, the user is able to observe if the battery backup is operating properly.

In some embodiments, the battery backup may be integrated with the fixture and/or the fixture mounting components while the test control is remotely located. In some embodiments, the battery backup components may be integrated with the remote test control.

In some embodiments, the remote test control is associated with a plurality of fixtures and/or battery backup components. In some such embodiments, the remote test control may simultaneously test each of the plurality of fixtures and/or batteries. In some embodiments, the remote test control may include additional controls to independently select which of the plurality of fixtures and/or batteries to test.

In some embodiments, the remote test control may be integrated into a computer operation system. In such as system, test information may be electronically monitored, recorded and/or maintained. In some embodiments, the system may include one or more additional components to facilitate remote electronic testing, such as wireless controls, cameras, optical sensors and/or other components. In some embodiments, the remote test control is designed to evaluate the light output across a light fixture.

In some embodiments, the method of monitoring and/or testing a fixture with light diffusion techniques includes disconnecting power from the fixture, recording the light output from the fixture using one or more optical recognition devices, comparing the light output to an anticipated light output and/or create a report based upon the success or failure of the comparison of light output. In some methods, the report may provide a visual illustration of the point of failure.

A BRIEF DESCRIPTION OF THE DRAWINGS

Embodiments will now be described, by way of example only, with references to the accompanying drawings in which.

DETAILED DESCRIPTION

While this invention may be embodied in many different forms, there will herein be described in detail preferred embodiments of the invention with the understanding that the present disclosure is to be considered as an exemplification of the principles of the invention and is not intended to limit the broad aspects of the invention to the embodiments illustrated. Certain figures are layouts of the design of the present disclosure for illustrative purposes and the disclosure should not be considered limited to the layouts of the present disclosure. It will be understood that the invention may be embodied in other specific forms without departing from the spirit or central characteristics thereof. The present embodiments, therefore, are to be considered in all respects as illustrative and not restrictive, and the invention is not to be limited to the details given herein. One skilled in the art will recognize that the test control system may be associated with a derangement signal system.

Figure 1:
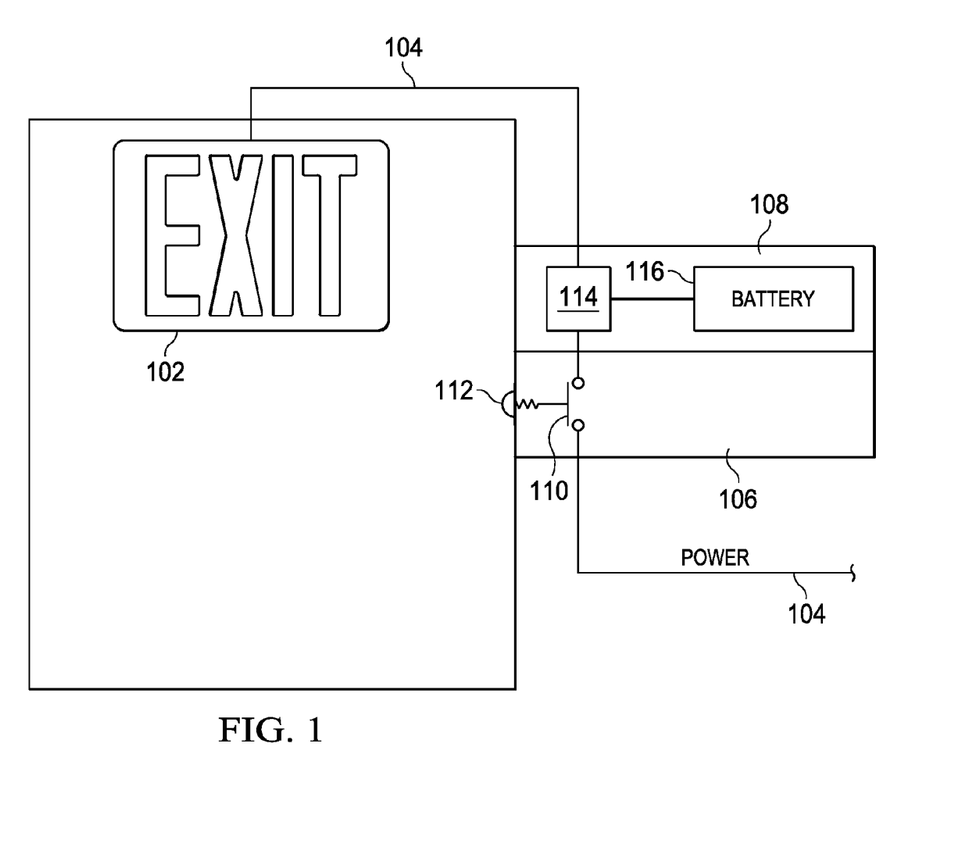
FIG. 1 depicts an embodiment of a test control system layout.

FIG. 1 depicts an illustrative embodiment of a derangement system layout for a light fixture 102. The light fixture 102 is connected to a power source by power line 104 during the regular course of operation. In some embodiments, the power line 104 may be connected to the light fixture 102 independent of other electronic components. In some embodiments, one or more light fixtures 102 may be connected to the power line 104. In some emergency embodiments, a plurality of light fixtures 102 may be connected in parallel in order to minimize the likelihood that one failure will impact all of the light fixtures. In some embodiments, the same power line 104 may be connected to multiple electronic components. For example, the power line 104 may connect to a plug then to the light fixture 102. In some embodiments, the power source may be connected to a plurality of power lines 104.

In the embodiment shown, the power line 104 is connected to the light fixture 102 through components for the test control 106 and battery backup 108. In the embodiment shown, the test control 106 includes a line connection 110 which is operable in a default setting to maintain the power connection across the power line 104 to the light fixture 102. Derangement button 112 may be pressed to disengage the default connection created by line connection 110 and thereby cut off the power from power line 104 to the light fixture 102.

In some embodiments, one or more alternative components may be implemented to facilitate the controls illustrated by the line connection 110 and the derangement button 112 in the embodiment shown. For example, the derangement button 112 may be replaced by a knob or key which may be rotated between an on position and a test position. For another example, the derangement button 112 may be replaced by an electronic control which requires a user identification and/or password to disengage the power line 104 within the test control 106.

In the embodiment shown, the battery backup 108 is depicted with the test control 106. In some embodiments, the battery backup 108 may be located at other points in the system, such as in a control room, in a mounting box for the light fixture 102, in the light fixture 102 and/or other locations.

In this embodiment, the battery backup 108 includes a control box 114 and a battery 116. The control box 114 is operable to facilitate the battery backup system, including identifying a change in power along power line 104 from the power source and transitioning between the power from the power source to utilizing power from the battery 116. In some embodiments, identification of a change in power along power line 104 may include recognition of a loss in power or an increase in power, wherein the control box 114 may determine which source of power should be connected to the light fixture 102. For example, when the power line 104 is disconnected by actuating derangement button 112, the control box 114 may recognize the loss in power and facilitate the transition to utilization of power from the battery 118. For another example, when the power line 104 begins carrying power, the control box 114 may recognize the increase in power and facilitate the transition to utilization of power from the power source associated with the power line 104. Embodiments of identification of a change in power may vary and remain within the scope and spirit of the present disclosure. In addition, embodiments of transitioning between power supplies may vary and remain within the scope and spirit of the present disclosure.

In some embodiments, the control box 114 may also be utilized to recharge and/or maintain the charge of battery 116. In some embodiments, the control box 114 may include one or more additional features, such as additional warning systems which may provide an indication that the power has been lost at the control box 114. In some embodiments, the control box 114 may include one or more test features to further evaluate the operation of the battery backup system. Embodiments of the control box 114 may vary in features and operations for facilitating the battery backup system and remain within the scope and spirit of the present disclosure.

Figure 2:
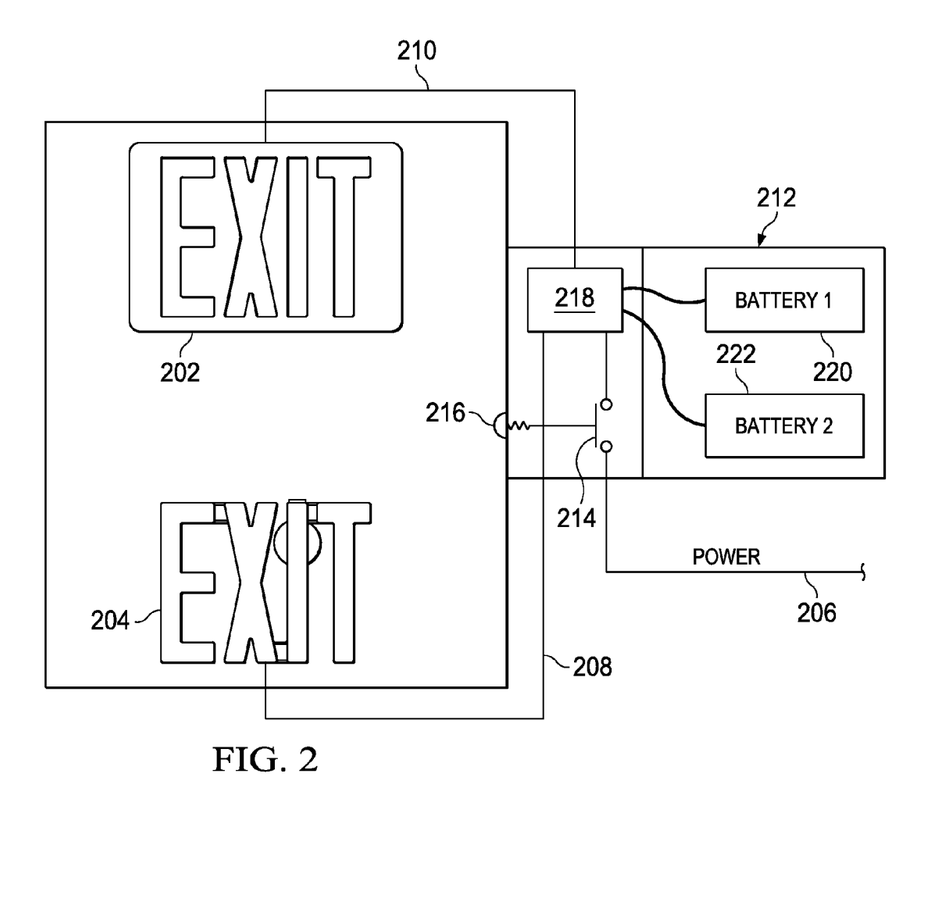
FIG. 2 depicts an embodiment of a test control system layout with a plurality of fixtures.

FIG. 2 depicts an illustrative embodiment of a derangement system layout for a plurality of light fixtures 202 and 204. In this embodiment, the light fixture 204 is depicted as an exit sign with a light diffusing design and individualized letters. The light fixture 202 is connected to a power source by second line 210 to power line 206 during the regular course of operation. The light fixture 204 is connected to a power source by first line 208 to power line 206 during the regular course of operation. In some embodiments, the same power line 206 may be connected to multiple electronic components. For example, the power line 206 may connect to one or more plugs then to the light fixtures 202 and 204.

In the embodiment shown, the power line 206 is connected to the light fixtures 202 and 204 through components for test and battery backup controls 212. In the embodiment shown, test and battery backup controls 212 include a line connection 214, a derangement button 216, a power management box 218, a first battery 220 and a second battery 222. In the embodiment shown, the line connection 214 is operable in a default setting to maintain the power connection from the power line 206 to the power management box 218 which transfers power to the light fixtures 202 and 204 through the first line 208 and second line 210.

Derangement button 216 may be pressed to disengage the default connection created by line connection 214 and thereby cut off the power from power line 206 to the power management box 218. In some embodiments, one or more alternative components may be implemented to facilitate the controls illustrated by the line connection 214 and the derangement button 216 in the embodiment shown.

In this embodiment, the power management box 218 is operable to facilitate the battery backup system, including identifying a change in power along power line 206 and transitioning between the power from the power line 206 to utilizing power from at least one of the batteries 220 and 222. In some embodiments, identification of a change in power along power line 206 may include recognition of a loss in power or an increase in power. Based upon the identified change in power, the power management box 218 may determine which source of power should be connected to the light fixtures 202 and 204. For example, when the power line 206 becomes disconnected due to an emergency situation, the power management box 218 may recognize the loss in power and facilitate the transition to utilization of power initially from the battery 220 and subsequently from battery 222. For another example, when the power line 206 begins carrying power from an independent backup generator, the power management box 218 may recognize the increase in power and facilitate the transition to utilization of power from the backup generator associated with the power line 206. Embodiments for the identification of a change in power may vary and remain within the scope and spirit of the present disclosure. In addition, embodiments for transitioning between power supplies may vary and remain within the scope and spirit of the present disclosure.

In some embodiments, the power management box 218 may also be utilized to recharge and/or maintain the charge of batteries 220 and 222. In some embodiments, the power management box 218 may include one or more additional features, such as additional warning systems which may provide an indication that the power has been lost at the power management box 218. In some embodiments, the power management box 218 may include one or more test features to further evaluate the operation of the battery backup system. For example, the power management box 218 may include components to test the current charge of battery 220 and battery 222 and components to output data regarding the charge of each battery. Embodiments of the power management box 218 may vary in features and operations for facilitating the battery backup system and remain within the scope and spirit of the present disclosure.

In some embodiments, batteries 220 and 222 are each associated with one of the lighting fixtures 202 and 204. For example, power management box 218 may connect the battery 220 with the light fixture 202 and the battery 222 with the light fixture 204 when the power on power line 206 is unavailable. In some embodiments, the batteries 220 and 222 may each be associated with a plurality of light fixtures, such as the light fixtures 202 and 204. In some embodiments, the batteries 220 and 222 may provide redundant battery backup power wherein one battery operates as a backup to another battery. In some embodiments, additional battery backup systems and components may be integrated into the system to provide additional redundancy. The test system and components may be assigned to evaluate the operation of multiple backup components independently.

Figure 3:
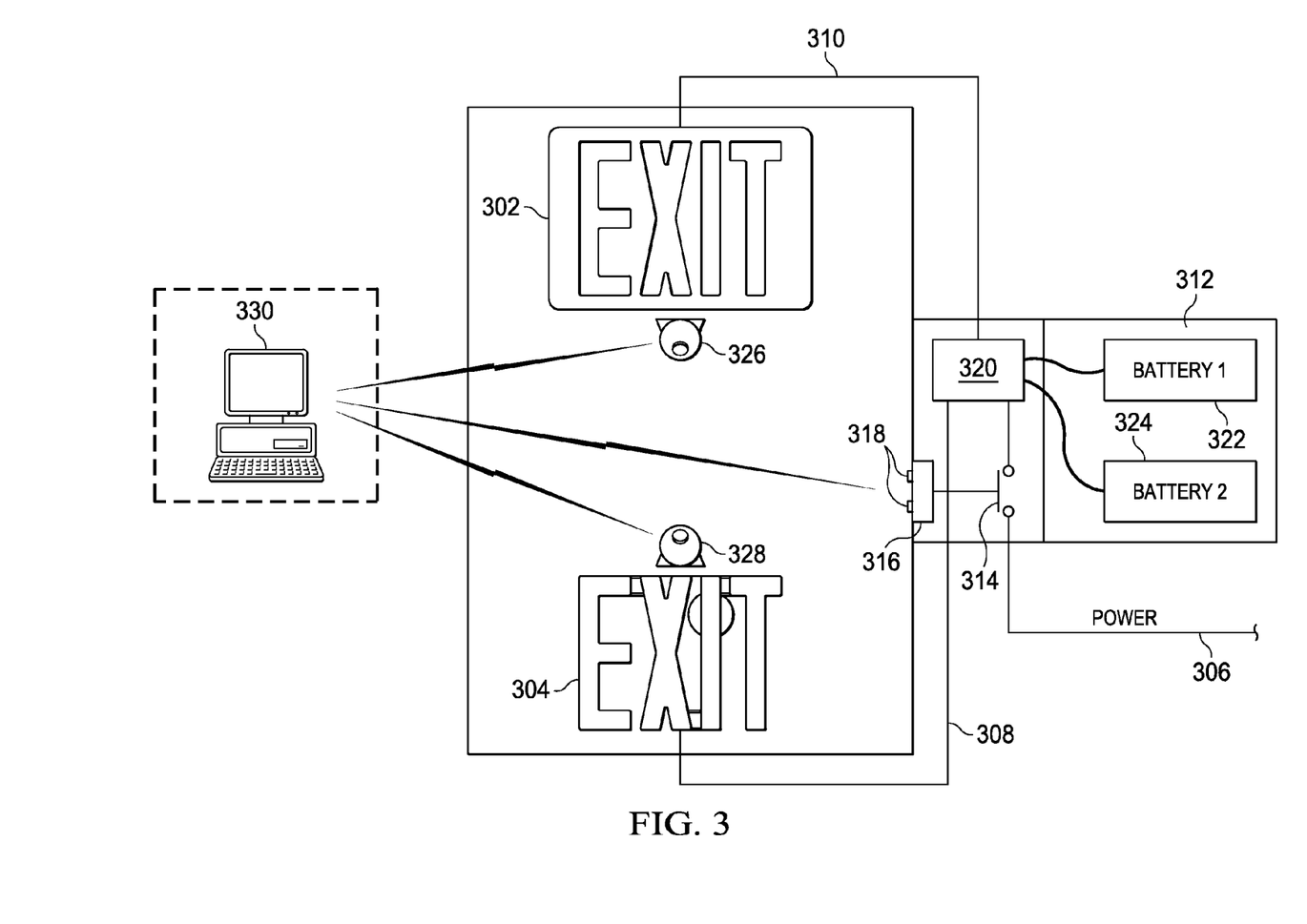
FIG. 3 depicts another embodiment of a test control system layout with a plurality of fixtures.

FIG. 3 depicts another illustrative embodiment of a derangement system layout for a plurality of light fixtures 302 and 304. In this embodiment, the light fixture 304 is depicted as an exit sign with a light diffusing design and individualized letters. The light fixture 302 is connected to a power source by second line 310 to power line 306 during the regular course of operation. The light fixture 304 is connected to a power source by first line 308 to power line 306 during the regular course of operation. In some embodiments, the same power line 306 may be connected to multiple electronic components.

In the embodiment shown, the power line 306 is connected to the light fixtures 302 and 304 through components for test and battery backup controls 312. In the embodiment shown, the test and battery backup controls 312 include a line connection 314, a derangement control 316, indicators 318, a power management box 320, a first battery 322 and a second battery 324. In some embodiments, the test and battery backup controls 312 are located in a concealed location, such as in a utility closet, behind a wall panel or other obstruction, in a control room, etc. In some buildings, multiple test and battery backup controls 312 may be dispersed within the building and independently or collectively operable by the derangement system.

In the embodiment shown, the line connection 314 is operable in a default setting to maintain the power connection from the power line 306 to the power management box 320 which transfers power to the light fixtures 302 and 304 through the first line 308 and second line 310. Derangement control 316 may be triggered by a remote computer 330 to disengage the default connection created by line connection 314 and thereby cut off the power from power line 306 to the power management box 320. The derangement control 316 includes one or more components designed to communicate with the remote computer 330 and actuate the line connection 314. In some embodiments, the remote computer 330 may replaced and/or augmented with additional devices, such as phones, tablets, remote controls and/or other devices, which may be used to operate, evaluate and/or observe the system as disclosed herein. In this embodiment, the derangement control 316 also includes the indicators 318 which may be any indicating device and/or output, such as lights, LEDs, speakers, mechanical outputs, etc. For example, the indicators 318 may indicate whether a test of the backup system is underway. For another example, the indicators 318 may provide a pass/fail indication of one or more tests. For yet another example, the indicators 318 may provide different outputs which indicate whether each of the batteries 322 and 324 are fully charged. Embodiments of the system may include any number, placement and/or types of indicators, and the indicators may be associated with a variety of information.

In the embodiment shown, the derangement control 316 is wirelessly connected to the remote computer 330. The components may be wirelessly connected using any wireless communication system or combination of systems operable to communicate controls, information and/or other data the distance between the derangement control 316 and the remote computer 330. In some embodiments, the derangement control 316 is connected to a remote computer 330 via a wired system. One skilled in the art will recognize that the communication between the derangement control 316 and the remote computer 330 may be facilitated by one or more wireless and/or wired communication components and standards and remain within the scope and spirit of the present disclosure.

This embodiment also includes a pair of cameras 326 and 328 associated with the light fixtures 202 and 204. In some embodiments, the cameras 326 and 328 are spaced apart from the light fixtures 202 and 204 and are dedicated to recording the operation of the light fixtures 202 and 204. In some embodiments, one or more of the cameras 326 and 328 may be cameras which are otherwise purposed, but may be leveraged by the derangement system when needed. For example, the cameras 326 and 328 may be primarily used for security purposes.

Within some embodiments of the derangement system, the cameras 326 and 328 used to record the operation of light fixtures 302 and 304. In some embodiments, the remote computer 330 is wirelessly associated with the cameras 326 and 328 and operable to monitor, display and/or store the video recorded by cameras 326 and 328. Embodiments of the system may include one or more wireless or wired communication components and/or capabilities to associate the remote computer 330 with the cameras 326 and 328. During operation of the derangement system, the remote computer 330 may control the cameras 326 and 328 to view the light fixtures 302 and 304 such that the user of the remote computer 330 may remotely view the light fixtures 302 and 304 on a display of the remote computer 330. When the light fixtures 302 and 304 are properly framed on the display of the remote computer 330, the user may initiate a test of the derangement system by triggering the derangement control 316 to disengage line connection 314. The user may observe the operation of the light fixtures 302 and 304 during the derangement test to ensure the backup system is properly operating.

In some embodiments, the system may be configured to automatically conduct and record derangement tests. For example, the system may periodically initiate derangement tests by setting the cameras 326 and 328 to record the light fixtures 302 and 304. In some embodiments, the system is designed to optically recognize the proper frame for recording each light fixture 302 and 304. After setting the cameras 302 and 304, the system may initiate the recording process for the cameras 302 and 304 as well as any other monitoring systems associated with the derangement test, such as battery monitoring systems, line current or voltage recorders, other light sensors, etc. As the components are recording, the system will trigger the derangement control 316 to cause the disengagement of the line connection 314. During a defined period while the power line 306 is disengaged, the system will monitor and record the operational characteristics of the backup system. Following the defined period, the system will cause the derangement control 316 to reengage the line connection 314 returning power to the system over power line 306. In some embodiments, the recording process will collect additional information following the reengagement of the power to confirm the transition was successful. The remote computer 330 may then create a log of the test with the recorded information to show the test was successful and/or to document a failure. In some embodiments, results may be transmitted to one or more designated system users.

In this embodiment, the power management box 320 is operable to facilitate the battery backup system, including identifying a change in power along power line 306 and transitioning between the power from the power line 306 to utilizing power from at least one of the batteries 322 and 324. In some embodiments, identification of a change in power along power line 306 may include recognition of a loss in power or an increase in power. Based upon the identified change in power, the power management box 320 may determine which source of power should be connected to the light fixtures 302 and 304. Embodiments for the identification of a change in power may vary and remain within the scope and spirit of the present disclosure. In addition, embodiments for transitioning between power supplies may vary and remain within the scope and spirit of the present disclosure.

In some embodiments, the power management box 320 may include one or more additional features, such as additional warning systems which may provide an indication that the power has been lost at the power management box 320. In some embodiments, the power management box 320 may include one or more test features to further evaluate the operation of the battery backup system. In some embodiments, the power management box 320 may also be associated with the remote computer 330 through a wired and/or wireless connection. In such embodiments, any warnings, controls, test readings and/or other information may be communicated to the remote computer 330. Embodiments of the power management box 320 may vary in features and operations for facilitating the battery backup system and remain within the scope and spirit of the present disclosure.

In some embodiments, batteries 322 and 324 are each associated with one of the lighting fixtures 302 and 304. In some embodiments, the batteries 322 and 324 may each be associated with a plurality of light fixtures, such as the light fixtures 302 and 304. In some embodiments, the batteries 322 and 324 may provide redundant battery backup power wherein one battery operates as a backup to another battery. In some embodiments, additional battery backup systems and components may be integrated into the system to provide additional redundancy. The test system and components may be assigned to evaluate the operation of multiple backup components independently.

In some embodiments, one or more alternative components may be implemented to facilitate the operations disclosed herein. For example, the cameras 326 and 328 may be replaced and/or augmented with the use of light sensors to evaluate and/or observe the operation of the light fixtures during the derangement test.

In some embodiments, the sensors and/or components may be designed to monitor, record and/or analyze the light emission characteristics of the light fixture 302 and 304. For example, the sensors may include optical, thermal and/or other sensors to observe and/or map the level of light emissions from the light fixture 304. In such an embodiment, light diffusion characteristics of the light fixture 304 may be tested during the backup battery operation.

Figure 4:
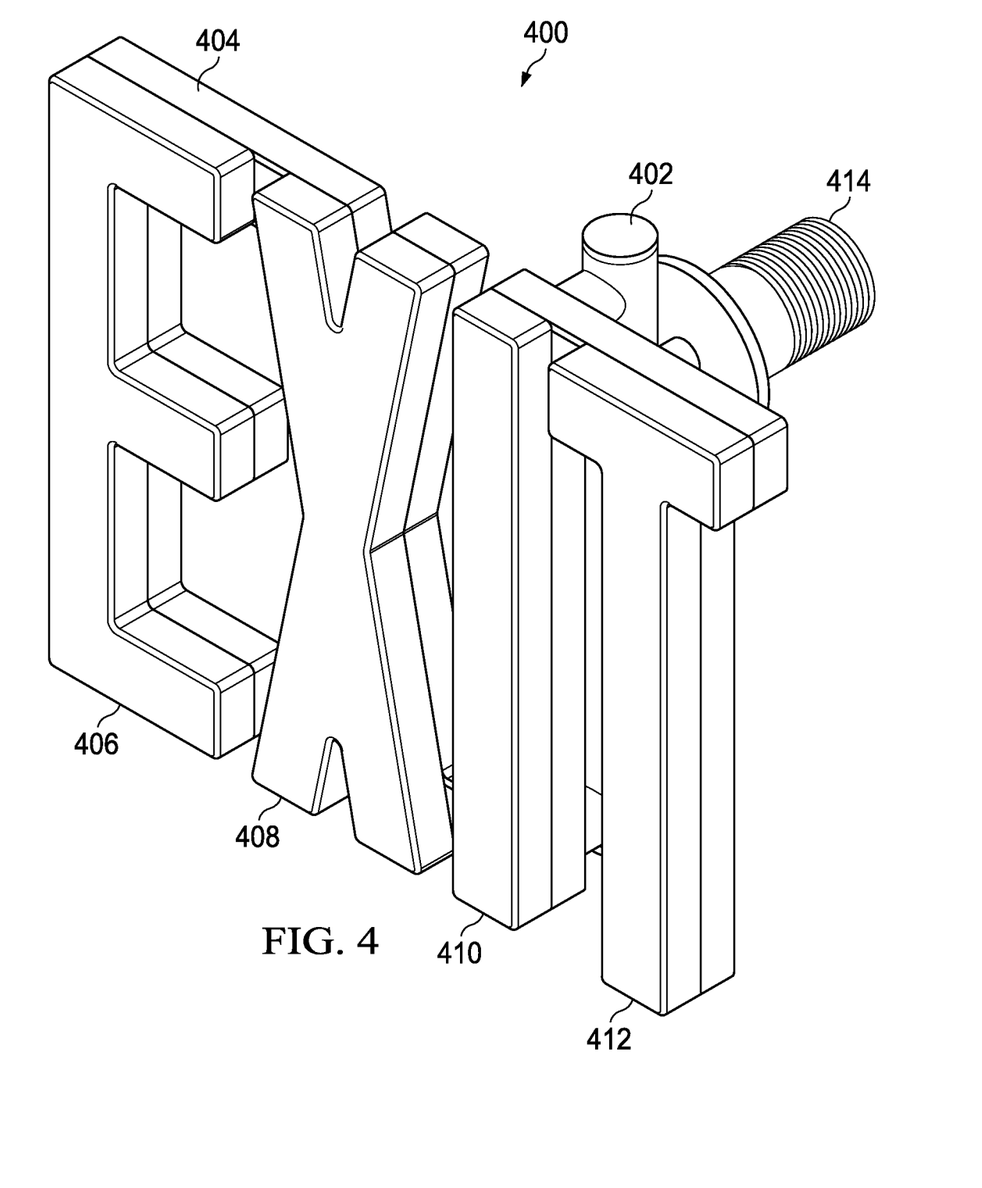
FIG. 4 is a perspective view of an embodiment of a light fixture having light diffusion components.

FIG. 4 depicts an embodiment of a sign 400 having individualized lettering. In some embodiments, the sign 400 includes light diffusion elements. In the embodiments shown, the sign 400 is depicted as an EXIT sign. Although the EXIT sign is used for illustrative purposes, other lettering and/or shape designs may be created using the principles, methods, design features and/or components of the present disclosure and remain within the scope and spirit of the disclosure.

In the embodiment shown, the sign 400 includes a mounting bracket 402 attached to a back plate 404. In this embodiment, letters 406, 408, 410 and 412 are attached to the front of the back plate 404 and are individualized from each other. For example, the letter "E" 406 is spaced apart from the letter "X" 408. The letters 406, 408, 410 and 412 operate as lenses for the emission of light from the sign 400. The back plate 404 is configured to match the lettering to create the three-dimensional individualized letters. In some embodiments, the back plate 404 connects the individualized letters 406, 408, 410 and 412 in a serpentine pattern. The connection of the individualized letters 406, 408, 410 and 412 by the back plate 404 may be in one or more structured patterns and/or random selections and remain within the scope and spirit of the present disclosure.

In some embodiments, the sign 400 is designed to be illuminated from within the lettering components. In such a design, the letters 406, 408, 410 and 412 may be made of a translucent material, such as plastic, acrylic, glass, etc. In some embodiments, the material may be colored, such as red, green, yellow, orange, blue, etc., to provide an intended illuminated appearance. In some embodiments, the letters 406, 408, 410 and 412 may be of equal or similar depth to the depth of the back plate 404.

In this embodiment, the mounting bracket 402 is shown as a vertical tube concealed behind the letter "I" 410 with a connector 414 horizontally disposed from the mounting bracket 402 away from the remainder of the components of the sign 400. In some embodiments, the design of the mounting bracket 402 may vary based upon factors associated with the placement of the sign 400 and any purpose associated with the sign. For example, the mounting bracket 402 may extend vertically to mount from a ceiling or floor, parallel with the lettering to mount from either side and/or at any other angle to provide a variety of placement designs and options. In this embodiment, the connector 414 is depicted as a threaded connection. Embodiments of the sign 400 may incorporate any number of connection designs which will support the sign 400 in the intended environment and placement. For example, the connector 414 may comprise a friction connection, an adhesive connection, a mechanical connection, a magnetic connection, an interlocking connection and/or any other type of connection.

Figure 5:
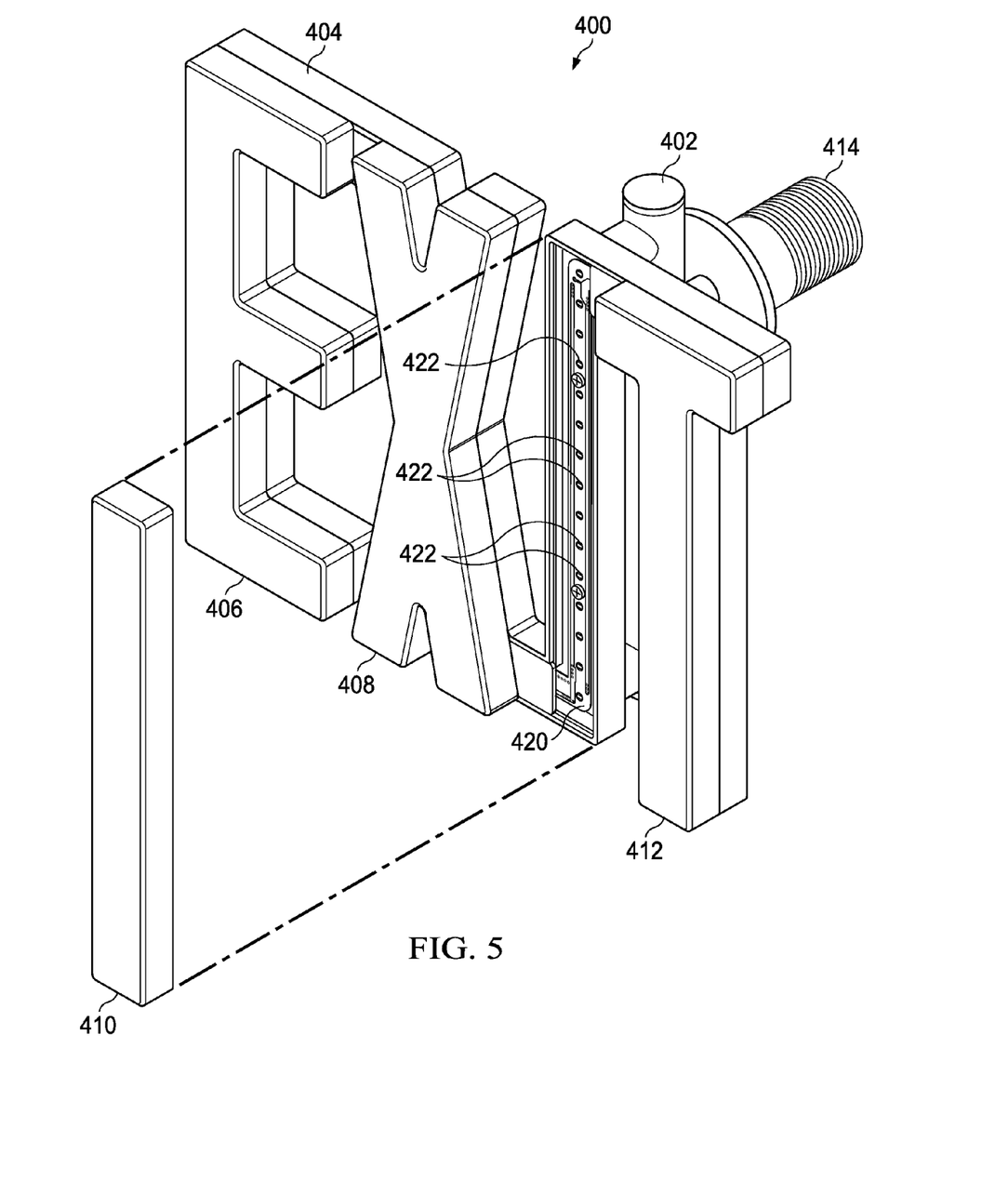
FIG. 5 is an open view of an embodiment of a light fixture showing an embodiment of internal electronic components.

FIG. 5 depicts an embodiment of sign 400 having individualized lettering with the letter "I" 410 separated from the back plate 404. In the embodiment shown, the sign 400 includes a circuit board 420 within the back plate 404. A portion of circuit board 420 is exposed by the separated letter "I" 410 to illustrate the placement of the circuit board 420. In some embodiments, a single circuit board 420 may be designed to fit within the design of the entire back plate 404 for sign 400. In some embodiments, the sign 400 may contain a series of connected and/or associated circuit boards 420 within the back plate 404 of sign 400. For example, a separate circuit board 420 may be associated with each of the letters 406, 408, 410 and 412. In such an embodiment, the components may be designed to create customized designs from selection of the designated components.

In this embodiment, the circuit board 420 includes LEDs 422 mounted along the length of the exposed portion of circuit board 420. The number of LEDs 422 mounted along the length of circuit board 420 behind the letter "I" 410 may vary and remain within the scope and spirit of the present disclosure. In preferred embodiments, the number of LEDs 422 is coordinated with the light diffusion characteristics of the design elements to provide the desired light characteristics from the sign.

In the embodiment shown, the LEDs 422 are mounted to the back of the circuit board 420 to create an increased distance between the LEDs 422 and the interior surface of the letters 406, 408, 410 and 412 as compared to front mounted LEDs 422. The LEDs 422 are placed behind holes in the circuit board 420. During operation, the light passes through the holes and diffuses in the open space between the LEDs 422 and the interior surface of the letters 406, 408, 410 and 412. The increased distance created by back mounting the LEDs 422 on the circuit board 420 provides for more light diffusion to occur before the light reaches the interior surface of the letters 406, 408, 410 and 412.

In some embodiments, the interior of the back plate 404 may include reflective or semi-reflective characteristics. In such an embodiment, a portion of light created by the LEDs 422 may be reflected off the interior surface of the back plate 404 to create additional light dispersion and a more uniform light distribution from the letters 406, 408, 410 and 412. For example, the back plate 404 may be designed from a reflective material (such as aluminum or another metal) which provides a reflective surface within the cavity behind the letters 406, 408, 410 and 412. In some embodiments, the interior surface of the back plate 404 may be polished, treated, integrated with reflective material and/or otherwise conditioned to create a reflective or semi-reflective interior surface. In some embodiments, the exterior surface of the back plate 404 does not include the reflective characteristics found on the interior surface. In some embodiments, the back plate 404 may be made of a non-reflective material, but include a reflective material lining the interior surface of the back plate 404.

Figure 6:
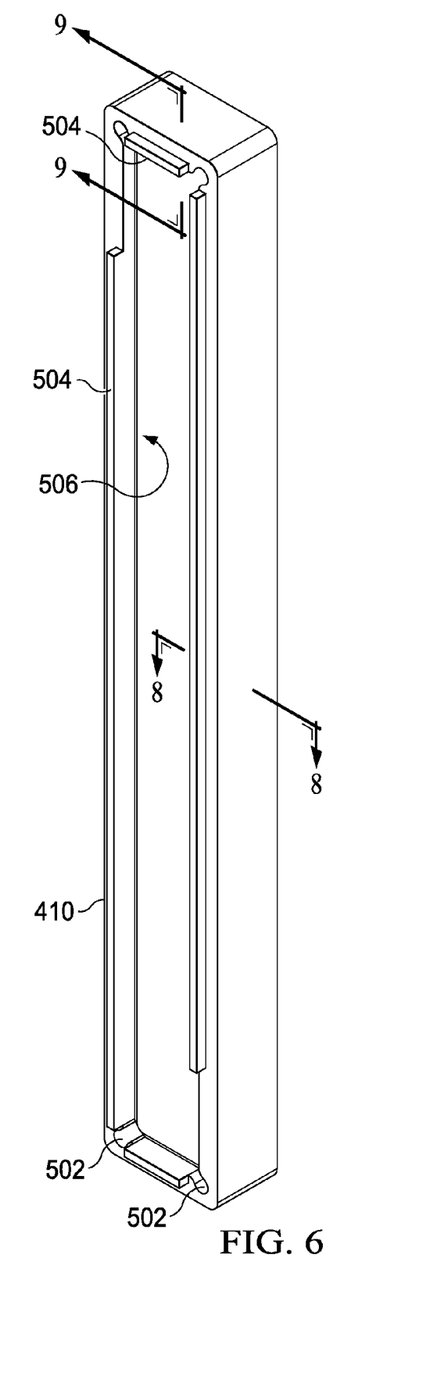
FIG. 6 is a perspective view of the interior of an embodiment of a letter having light diffusion components.

FIG. 6 shows a perspective interior view of the letter "I" 410. The letter "I" 410 is used a an illustrative example, and the design elements described in conjunction with the letter "I" 410 may be implemented within other letters and/or shapes and remain within the scope and spirit of the present disclosure. The design of the letter "I" 410 includes light diffusion elements to create a desired distribution of light from the surface of the letter "I" 410 during use. In the embodiment described, the elements of the letter "I" 410 are designed to create an approximately uniform distribution of light from the surface of the letter "I" 410.

The letter "I" 410 includes depth channels 502 in each of the four corners travelling along the depth of the letter "I" 410 from an interior surface of the front to the back of the letter "I" 410. The letter "I" 410 also includes interior channels 506 along the corners between the interior surface of the front and the interior surfaces of the sides. In some embodiments, these channels 502 and 506 provide additional light diffusion characteristics to the letter "I" 410. The channels 502 and 506 allow the light to travel through the air further into the corners of the letter "I" 410 before passing through the translucent material allowing the light to emit from the surfaces and corners of the letter "I" 410 with the same approximate luminosity, and limiting any visibly diminished or intensified areas of light.

In some embodiments, the channels 502 and 506 are milled into the letters and/or shapes as appropriate to create the desired light diffusive characteristics. In some embodiments, the letters may be molded, printed or otherwise created with the channels 502 and 506 in the material. One skilled in the art will recognize that any method of creating the channels 502 and 506 may be employed and remain within the scope and spirit of the present disclosure.

In some embodiments, the angles, depths, patterns and/or other characteristics of the channels 502 and 506 may be altered to create the desired light emission pattern from the exterior surface of the letter and/or shape. In some embodiments, the characteristics of the channels 502 and 506 may be designed based upon characteristics of the translucent material, the letter and/or shape, the natural luminosity of each light source, the distance from each light source, the number of light sources, the desired light emission pattern and/or other characteristics. For example, channels 502 and/or 506 may be modified based upon different colors of acrylic materials which have distinct light degradation and/or dispersion characteristics.

In addition to the channels 502 and 506, extensions 504 are shown along the back edges of the letter "I" 410 in this embodiment and are designed to fit with the back plate 404 shown in FIG. 5. In some embodiments, these extensions 504 are designed to connect the translucent material of letter "I" 410 with the back plate 404 through a friction connection. In some embodiments, alternative connections may be used in place of or in conjunction with the friction connection, such as adhesives, snaps, screws, bolts, interlocking elements and/or other connections.

Figure 7:
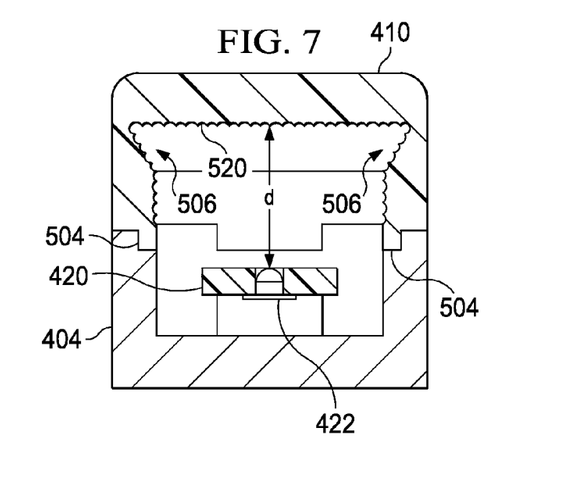
FIG. 7 is a cross-section view of an embodiment of a portion of the light fixture having light diffusion components.

FIG. 7 illustrates a cross-sectional view of the letter "I" 410 attached to the back plate 404. As discussed above, this embodiments includes the circuit board 420 with the LED 422 attached to the back plate 404. The back mounted LED 422 is shown to be a distance of "d" from the interior surface of the letter "I" 410. As one skilled in the art will recognize, by back mounting the LED 422 on the circuit board 420 the distance "d" is greater than it would be to top mount the LED 422 on the circuit board 420.

In this embodiment, the back plate 404 is designed to fit with the extensions 504 of the letter "I" 410. This embodiment also depicts the interior channels 506 within the corners of the letter "I" 410. As discussed above, the channels 506 may provide light diffusion characteristics and may be utilized to create an approximately uniform light distribution from the letter "I" 410.

In the embodiment shown, the interior of the letter "I" 410 also includes a plurality of divots 520. The divots 520 may also be referred to as indentions, pits and/or other curvatures in the surface of the translucent material. In some embodiments, the divots 520 may be on the interior and/or exterior surface of the translucent material. In some embodiments, the divots 520 may increase the surface area and the angles in which light enters and/or exits the translucent material causing further light diffusion characteristics.

The embodiment shown in FIG. 7 illustrates three separate features for diffusing light as discussed herein. First, the LED 422 is back mounted on the circuit board 420 to create an increased distance "d" to the interior surface of the letter "I" 410 which allows the light to diffuse in the space between the LED 422 and the interior surface of the letter "I" 410. Second, the interior channels 506 provide improved access for the light to enter the corners of the letter "I" 410 which allows for a more equalized dissipation of light traveling through the translucent material across the surfaces and into the corners. Finally, the divots 520 provide the increased surface area and angles of entry into the translucent material increasing the diffusion of light traveling through the translucent material.

In addition to the light diffusion features illustrated explicitly in FIG. 7, the design may incorporate additional light diffusion features. For example, the interior surface of the back plate 404 may reflect a portion of light created by the LEDs 422 to create additional light dispersion and a more uniform light distribution from the surface of letter "I" 410. The back plate 404 may be designed from a reflective material (such as aluminum), and/or the interior surface of the back plate 404 may be polished, treated, integrated with reflective material and/or otherwise conditioned to create a reflective or semi-reflective interior surface. In some embodiments, the exterior surface of the back plate 404 does not include the reflective characteristics found on the interior surface. For another example, the design may include a distribution of LEDs to improve the light dispersion characteristics within the design of the letter "I" 410.

Figure 8:
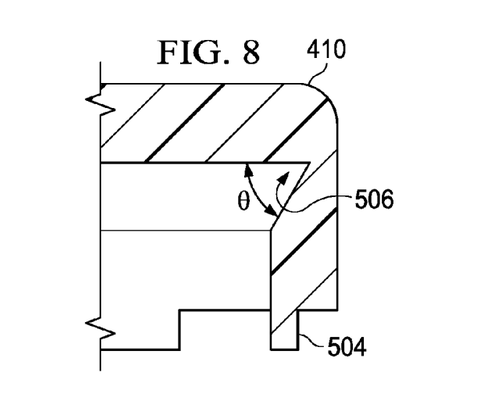
FIG. 8 is a partial cross-section view of an embodiment of a letter having light diffusion components.
Figure 9:
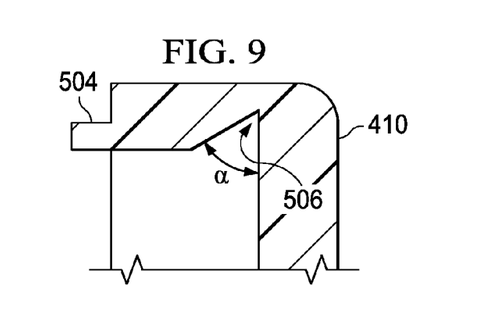
FIG. 9 is another partial cross-section view of an embodiment of a letter having light diffusion components.

FIGS. 8 and 9 depict exploded partial cross-section views of the letter "I" 410. FIG. 8 depicts an exploded partial cross-section view of the letter "I" 410 along the line indicated in FIG. 6. In this view, the interior channel 506 is shown with the angle "θ". The angle "θ" in this embodiment is shown between the interior surface of the front of the letter "I" 410 and a section cut out of the interior surface of the side of the letter "I" 410 beneath the extension 504.

FIG. 9 depicts an exploded partial cross-section view of the letter "I" 410 along the line indicated in FIG. 6. In this view, the interior channel 506 is shown with the angle "α". The angle "α" in this embodiment is shown between the interior surface of the front of the letter "I" 410 and a section cut out of the interior surface of the top of the letter "I" 410 beneath the extension 504.

In some embodiments, the angles "θ" and "α" are designed to be equal. In some embodiments, the angles "θ" and "α" are different. In some embodiments, the angles may vary based upon a variety of factors as discussed above, such as the luminosity of the light source and/or the proximity to the light source. In some embodiments, the angles "θ" and "α" may be cut into the front surface instead of the side and/or top surfaces. In some embodiments, the angles "θ" and "α" may be cut into both the front surface and the side or top surfaces.

The invention being thus described and further described in the claims, it will be obvious that the same may be varied in many ways. Such variations are not to be regarded as a departure from the spirit and scope of the invention and all such modifications as would be obvious to one skilled in the art are intended to be included within the scope of the system, apparatus and method described.

The invention claimed is:
1. A light fixture having an approximately uniform light distribution pattern comprising:
   a back plate;
   a translucent lens attached to said back plate defining an interior cavity, wherein said translucent lens comprises a front wall and a second wall between said front wall and said back plate;

a plurality of light sources within said cavity defined by said back plate and said translucent lens; and a channel formed into junctions between said front wall and said second wall of the translucent lens and reducing thickness of at least one of said front wall or said second wall, wherein light disperses into said channel, and dimensions of said channel allow said approximately uniform light distribution pattern across an entire exterior flat surface of said front wall of said translucent lens.

2. The light fixture of claim 1 wherein said plurality of light sources comprises a plurality of light emitting diodes mounted on a circuit board, wherein said circuit board has a first surface facing toward said translucent lens and a second surface facing away from said translucent lens, wherein said light emitting diodes are mounted upon a said second surface of said circuit board.

3. The light fixture of claim 2 wherein said second wall of said translucent lens comprises a top wall, a bottom wall, a first side wall and a second side wall, and wherein said channel is located along junctions between said front wall and said second wall, and said translucent lens comprises a pitted surface texture along an interior surface of said translucent lens.

4. The light fixture of claim 1 wherein said second wall of said translucent lens comprises a top wall, a bottom wall, a first side wall and a second side wall, and wherein said channel is located along junctions between said front wall and said second wall.

5. The light fixture of claim 1 wherein said translucent lens comprises a pitted surface texture along an interior surface of said translucent lens, wherein said pitted surface texture comprises a plurality of divots.

6. A light fixture having an approximately uniform light distribution pattern comprising:

a back plate;

a translucent lens attached to said back plate defining an interior cavity, wherein said translucent lens comprises a front wall and a second wall between said front wall and said back plate;

a plurality of light sources within said cavity defined by said back plate and said translucent lens, wherein said plurality of light sources comprises a plurality of light emitting diodes mounted on a circuit board, wherein said circuit board has a first surface facing toward said translucent lens and a second surface facing away from said translucent lens, wherein said light emitting diodes are mounted upon said second surface of said circuit board; and a channel formed into junctions between said front wall and said second wall of the translucent lens and reducing thickness of at least one of said front wall or said second wall, wherein light disperses into said channel, and dimensions of said channel allow said approximately uniform light distribution pattern across an entire exterior flat surface of said front wall of said translucent lens.

7. The light fixture of claim 6 wherein said second wall of said translucent lens comprises a top wall, a bottom wall, a first side wall and a second side wall, and wherein said channel is located along said junctions between said front wall and said second wall.

8. The light fixture of claim 6 wherein said translucent lens comprises a pitted surface texture along an interior surface of said translucent lens.

\* \* \* \* \*

UNITED STATES PATENT AND TRADEMARK OFFICE
CERTIFICATE OF CORRECTION

PATENT NO. : 10,032,393 B2  
APPLICATION NO. : 14/456828  
DATED : July 24, 2018  
INVENTOR(S) : Mark Scott Wamble Page 1 of 1

It is certified that error appears in the above-identified patent and that said Letters Patent is hereby corrected as shown below:

In the Specification

Column 1, Line 30: delete "diming towards" and insert --dimming towards--

Column 3, Line 5: delete "such as" and insert --such a--

Column 4, Line 57: delete "118" and insert --116--

Column 6, Line 65: insert --be-- between "may" and "replaced"

Column 7, Line 18: insert --via-- between "data" and "the"

Column 7, Line 29: delete "202 and 204" and insert --302 and 304--

Column 7, Line 31: delete "202 and 204" and insert --302 and 304--

Column 7, Line 32: delete "202 and 204" and insert --302 and 304--

Column 7, Line 39: insert --are-- between "328" and "used"

Column 7, Line 66: delete "302 and 304" and insert --326 and 328--

Column 7, Line 67: delete "302 and 304" and insert --326 and 328--

Column 11, Line 41: delete "embodiments" and insert --embodiment--

In the Claims

Column 13, Line 16, Claim 2: delete "a" between "upon" and "said"

Signed and Sealed this  
Twenty-fifth Day of December, 2018

Andrei Iancu  
*Director of the United States Patent and Trademark Office*